(12) United States Patent
Honma et al.

(10) Patent No.: US 6,193,789 B1
(45) Date of Patent: Feb. 27, 2001

(54) ELECTROLESS COPPER PLATING SOLUTION AND METHOD FOR ELECTROLESS COPPER PLATING

(75) Inventors: Hideo Honma, 8-1-60, Sugita, Isogo-ku, Yokohama-shi, Kanagawa-ken; Tomoyuki Fujinami, Fujisawa; Yoshitaka Terashima, Fujisawa; Shinji Hayashi, Fujisawa; Satoru Shimizu, Fujisawa, all of (JP)

(73) Assignees: Hideo Honma, Yokohama; Ebara-Udylite Co., Ltd., Tokyo, both of (JP)

( * ) Notice: Subject to any disclaimer, the term of this patent is extended or adjusted under 35 U.S.C. 154(b) by 0 days.

(21) Appl. No.: 09/194,434
(22) PCT Filed: Dec. 26, 1996
(86) PCT No.: PCT/JP96/03829
  § 371 Date: Dec. 1, 1998
  § 102(e) Date: Dec. 1, 1998
(87) PCT Pub. No.: WO97/46731
  PCT Pub. Date: Dec. 11, 1997

(30) Foreign Application Priority Data

Jun. 3, 1996 (JP) .................................................. 8-160444

(51) Int. Cl.[7] ............................. C23C 18/38; C23C 18/40
(52) U.S. Cl. ......................................... 106/1.23; 106/1.26
(58) Field of Search ........................ 427/98, 437, 443.1; 428/618, 674; 106/1.23, 1.26

(56) References Cited

U.S. PATENT DOCUMENTS 4,297,436 * 10/1981 Kubotera et al. ..................... 430/310

(List continued on next page.)

FOREIGN PATENT DOCUMENTS

| | | |
|---|---|---|
| 60-155683 | 8/1985 | (JP) . |
| 2-30768 | * 2/1990 | (JP) . |
| 2-145771 | 6/1990 | (JP) . |
| 4-116176 | * 4/1992 | (JP) . |
| 4-157167 | * 5/1992 | (JP) . |
| 4-198486 | * 7/1992 | (JP) . |
| 6-302940 | 10/1994 | (JP) . |
| 7-240579 | * 9/1995 | (JP) . |

OTHER PUBLICATIONS

"Oils and Fats and a Surface Active Agent as Known Chemical Substances and Related Substances Thereof", Tokyo: Japan Soap and Detergent Assoc., Japan Surface–Active Agents Assoc., pp. 90–91, Apr. 1974.*

(List continued on next page.)

*Primary Examiner*—Shrive Beck
*Assistant Examiner*—Michael Barr
(74) *Attorney, Agent, or Firm*—Oblon, Spivak, McClelland, Maier & Neustadt, P.C.

(57) ABSTRACT

An electroless copper plating solution which is based on an electroless copper plating solution comprising a copper ion, a complexing agent, a hypophosphorous acid compound as a reducing agent, and a metallic catalyst for initiating a reductive reaction, as characterized by further comprising a lithium ion or both a lithium ion and a polyoxyethylene type surfactant, and a method for electroless copper plating using the same, as well as a plated product made by such a process. The electroless copper plating solution in the present invention enables a uniform and acicular copper film to be deposited on the surface of a plating object, and therefore can be used for improving the strength of adhesion between various metals and resins, including bonding of a copper foil to a resin as applied in a conductive circuit such as a multi-layer printed circuit board or in a copper-plated laminate.

3 Claims, 2 Drawing Sheets

U.S. PATENT DOCUMENTS

| | | |
|---|---|---|
| 4,563,217 | 1/1986 | Kikuchi et al. . |
| 4,632,852 | 12/1986 | Akahoshi et al. . |
| 4,818,286 * | 4/1989 | Jagannathan et al. .............. 106/1.23 |
| 4,908,242 * | 3/1990 | Hughes et al. .................... 427/443.1 |
| 5,338,342 | 8/1994 | Mallory, Jr. . |
| 5,502,893 * | 4/1996 | Endoh et al. ......................... 29/852 |

OTHER PUBLICATIONS

Tomoyuki Fujinami, The Journal Of The Surface Finishing Society Of Japan, vol. 42, No. 11, pp. 1068–1076, "The Present and Future Trends in the Electroless Copper Plating", 1991.

M. Matsuoka, et al., J. Electrochem. Soc., vol. 139, No. 9, pp. 2466–2470, "Kinetics of Electroless Copper Plating and Mechanical Properties of deposits", Sep., 1992.

* cited by examiner

ELECTROLESS COPPER PLATING SOLUTION AND METHOD FOR ELECTROLESS COPPER PLATING

TECHNICAL FIELD

The present invention relates to an electroless copper plating solution and a method of electroless copper plating utilizing this solution, and more specifically, to an electroless copper plating solution and a method of electroless copper plating, which together can have a uniform and acicular copper film deposited on the surface of a plating object, and therefore can be used for improving the strength of adhesion between various metals and resins including bonding of a copper foil to a resin as applied in a conductive circuit such as a multi-layer printed circuit board or in a copper-plated laminate; as well as to plated products which can be obtained by said method.

BACKGROUND ART

A multi-layer printed circuit board is conventionally manufactured by first preparing a copper-plated laminate for the inner layer by processing a copper foil on the copper-plated laminate to form a printed circuit; then providing the above copper foil with a surface roughening treatment (generally comprising degreasing, followed by a soft etching process as exemplified by treatment with ammonium persulfate, sodium persulfate, cupric chloride, sulfuric acid-hydrogen peroxide system and the like, as well as an activating treatment); subsequently building an acicular film of copper oxide or cuprous oxide on top of the foil by a process such as blackening or browning; and bonding a copper-plated laminate for the outer layer or copper foils in multiple layers with a material impregnated with a thermosetting resin (i.e. a "prepreg") to fabricate a multi-layer laminated board having a high adhesion strength.

Since an electric continuity has to be established to each layer of the multi-layer laminated board manufactured in the above process, a through-hole plating on holes drilled through the board is required. However, the conventional method has had a drawback where penetration of the acid solution used in the catalyst treatment process for plating through-holes or penetration of the plating solution in the electroless copper plating process tends to dissolve the film made up from copper oxide or cuprous oxide, thereby causing a phenomenon called "pink ring" (i.e. "haloing").

On the other hand, there has been an alternative method of manufacturing a multi-layer printed circuit board whereby a printed circuit is formed on a copper-plated laminate using a copper foil that is pre-processed by surface roughening to eliminate the need for surface roughening as well as the oxide film forming processes required in the method described above. This method, however, has shortcomings such as inferior pattern resolution for the printed etching resist or the etching resist for ultra-violet exposure, which are associated with the surface roughness on the copper foil.

In recent years, methods have been developed to correct the above mentioned shortcomings on copper-plated laminates and to enhance the adhesion strength by utilizing certain particular types of electroless copper plating processing (Japanese Patent Application Laid-Open Nos. 15980/1986, 15981/1986, and 41775/1986).

The above electroless copper plating process, however, in practice requires formalin as an essential reducing agent and presents problems such as (a) abnormal copper deposition on the substrate resin, (b) unstable plating bath, or (c) an obnoxious odor as well as a potential carcinogenicity.

The present inventors have recently developed a method for forming a uniform and acicular copper film with excellent adhesion strength using electroless copper plating (Japanese Patent Application Laid-Open No. 116176/1992). While this technology enables manufacturing of a copper-plated laminate having a high adhesion strength and without the aforementioned shortcomings, surfactants that can be used in the process are limited and the benefit of the invention has not always been available.

Accordingly, it has been necessary to improve the above technology to present a technology which is able to provide better adhesion strength and is more versatile.

DISCLOSURE OF INVENTION

While earnestly making research efforts to improve on the technology based on the Japanese Patent Application Laid-Open No. 116176/1992 as described above, the present inventors have discovered the unique fact that a lithium ion is extremely effective in facilitating a copper film with a uniform and acicular structure This and other findings, specifically that by having a lithium ion present in the electroless copper plating solution as prescribed in said technology, a uniform and acicular copper film with excellent adhesive strength can be obtained, either singly or with a polyoxyethylene type surfactant other than the polyoxyethylene type surfactants containing acetylene residue employed in said technology have consummated the invention as hereunder stated.

Accordingly, an object of the present invention is to provide an electroless copper plating solution which is based on an electroless copper plating solution comprising a copper ion, a complexing agent, a hypophosphorous acid compound as a reducing agent, and a metallic catalyst for initiating the reductive reaction, characterized by further comprising a lithium ion.

Another object of the present invention is to provide an electroless copper plating solution which is based on an electroless copper plating solution comprising a copper ion, a complexing agent, a hypophosphorous acid compound as a reducing agent, and a metallic catalyst for initiating the reductive reaction, characterized by further comprising a polyoxyethylene type surfactant and a lithium ion.

Yet another object of the present invention is to provide a method for electroless copper plating which deposits a uniform and acicular copper film on the surface of a plating object by using the above mentioned electroless copper plating solution, and also to provide plated products using said method.

BEST MODE FOR CARRYING OUT THE INVENTION

Figure 1:
FIG. 1 is an electron microscope picture showing the crystal structure of a copper film obtained with the electroless copper plating solution of Example 1.

While a variety of lithium salts such as lithium hydroxide, lithium carbonate, lithium sulfate, lithium chloride, lithium bromide, lithium fluoride, or lithium hydride can be used as a lithium source for supplying a lithium ion to the electroless copper plating solution in the present invention, lithium hydroxide and lithium carbonate are preferred from a handling point of view, as will be explained later, and because of the fact that there are no other counter ions remaining in the solution.

It is preferable to apportion a lithium ion at a ratio of 0.1 to 200 g/l, particularly between 1 and 100 g/l, in equivalents of lithium hydroxide in an electroless copper plating solution.

Note the above lithium ion can be added in the form of lithium hydroxide or lithium carbonate to also serve as a pH adjuster for the electroless copper plating solution, in which case sodium hydroxide or potassium hydroxide may be used together.

Meanwhile, for the polyoxyethylene type surfactant to be included in the electroless copper plating solution in the present invention, compounds that can be cited include a polyoxyethylene type surfactant containing acetylene residue, a polyoxyethylene adduct of an alkyl phenol, a polyoxyethylene adduct of a fatty acid amide, a polyoxyethylene-polyoxypropylene block polymer, a polyoxyethylene-polyoxypropylene adduct of ethylenediamine, and a secondary alcohol ethoxylate. Of these, the preferred surfactants include a polyoxyethylene type surfactant containing acetylene, a polyoxyethylene adduct of an alkyl phenol, and a polyoxyethylene adduct of a fatty acid amide.

For the polyoxyethylene type surfactant containing acetylene residue mentioned in the above listing of polyoxyethylene type surfactants, exemplary compounds may include those prepared by adding an alkylene oxide such as ethylene oxide to an alkynediol such as 2,4,7,9-tetramethyl-5-decyne-4, 7-diol, or 3, 6-dimethyl-4-octyne-3, 6-diol, where the preferred examples can be expressed in the formula (I) given below:

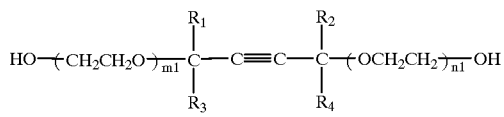

wherein $R_1$ and $R_2$ represent alkyl groups, $R_3$ and $R_4$ represent a hydrogen atom or a lower alkyl group, and ml and nl are numbers whose sum is equal to 3.5 to 30.

The polyoxyethylene type surfactant containing acetylene residue expressed in the above formula (I) is the polyoxyethylene type surfactant containing acetylene residue as disclosed in the Japanese Patent Application Laid-Open No.116176/1992, including, for example, surfactants sold under trademarks such as Surfinol 440, Surfinol 465, or Surfinol 485 (all manufactured by Nisshin Chemical Industries Co., Ltd.), which are available for actual application with satisfactory results.

For the polyoxyethylene adduct of an alkyl phenol, exemplary compounds include those prepared by adding an alkylene oxide mentioned above to an alkyl phenol such as nonyl phenol or octyl phenol, where the preferred examples can be expressed in the formula (II) given below:

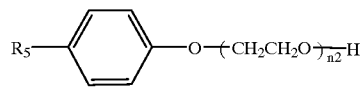

wherein $R_5$ represents an alkyl group and n2 is an integer between 2 and 110.

The polyoxyethylene adduct of an alkyl phenol expressed in the above formula (II) includes, for example, surfactants sold under trademarks such as Emulgen 985 (manufactured by Kao Corporation), Nonion NS-270 (manufactured by Nippon Oil & Fat Co., Ltd.), Newcol B-10 (manufactured by Nihon Surfactant Co., Ltd.), which are available for actual application.

For the polyoxyethylene adduct of a fatty acid amide, exemplary compounds include those prepared by adding an alkylene oxide such as mentioned above to a fatty acid amide such as stearyl amide or oleyl amide, where the preferred examples can be expressed in the formula (III) given below:

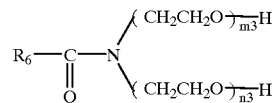

wherein $R_6$ represents an alkyl group and m3 and n3 are numbers whose sum is equal to 1 to 60.

The polyoxyethylene adduct of a fatty acid amide expressed in the above formula (III) includes, for example, surfactants sold under trademarks such as Esomide HT-60 or Esomide 0-15 (both manufactured by Lion Corporation) which are available for actual application.

Furthermore, polyoxyethylene type surfactants other than those mentioned above may include polyoxyethylene-polyoxypropylene block polymers sold under trademarks such as Pluronic P-85 or Pluronic L-44 (both manufactured by ASAHI DENKA KOGYO K. K.); polyoxyethylene-polyoxypropylene adducts of ethylenediamine sold under trademarks such as Tetronic TR-704 (manufactured by ASAHI DENKA KOGYO K. K.); secondary alcohol ethoxylates sold under trademarks such as Adekatol 80-145 (manufactured by ASAHI DENKA KOGYO K. K.); alkyl ethylene oxide adducts of carboxylic acids sold under trademarks such as PO of ethylenediamine sold under trademarks such as Tetronic TR-704 (manufactured by ASAHI DENKA KOGYO K. K.); secondary alcohol ethoxylates sold under trademarks such as Adekatol 80–145 (manufactured by ASAHI DENKA KOGYO K. K.); alkyl ethylene oxide adducts of carboxylic acids sold under trademarks such as PO MB-2621S (manufactured by Nikko Chemicals Co., Ltd.), which are available for actual application.

It is preferable to compound the above polyoxyethylene type surfactant in an electroless copper plating solution in the ratio of approximately 0.001 to 20 g/l, in particular between 0.01 and 10 g/l.

Additionally, other surfactants than the above mentioned polyoxyethylene type surfactants such as a naphthalene sulfonate-formalin condensation product sold under trademarks such as Demor N (manufactured by Kao Corporation), or a sodium alkyl naphthalene sulfonate sold under trademarks such as Perex NB-L (manufactured by Kao Corporation) may also be used.

While a copper film having an acicular crystal structure can be obtained in the electroless copper plating according to the present invention by using a lithium ion alone and without the help of a nonionic surfactant, it is preferable to use a nonionic surfactant, particularly a polyoxyethylene type surfactant containing acetylene, for reasons of stability as well as plating bath life.

Except for the lithium ion and the polyoxyethylene type that can complex the above copper ions, such as citric acid, tartaric acid, malic acid, EDTA, Quadrol, or glycine can be used.

For the hypophosphorous acid compound as a reducing agent, compounds such as hypophosphorous acid or sodium hypophosphite can be mentioned. As the metallic catalyst for initiating the reductive reaction, metals such as nickel, cobalt, or palladium can be used in the form of inorganic salts.

Referring to each ingredient of the electroless copper plating solution in the present invention, if nickel is used as the metallic catalyst for initiating the reductive reaction, it is preferable to have the copper ion concentration at 0.007 to 0.160 mol/l and the nickel ion concentration at 0.001 to 0.023 mol/l, where the desirable mol ratio between copper and nickel ions is approximately at 13:1.

It is preferable to use 1 to 10 times the amount of copper ions by mol ratio as a complexing agent. Also, it is preferable to formulate 0.1 to 1.0 mol/l of a hypophosphorous acid compound as a reducing agent.

In the event that another metal is used as the metallic catalyst for initiating the reductive reaction, the quantity and ratio given above may be applied while the most suitable quantities can be determined later by experiments.

The electroless copper plating solution in the present invention, in addition to ingredients as described above, may be formulated with various other ingredients as appropriate. One such other ingredient is a buffer agent for conditioning the solution pH.

It is noted here that an embodiment may be possible where the electroless copper plating solution in the present invention is prepared as a concentrated composition for dilution to several times or more by a diluent such as water at the time of application.

The electroless copper plating in the present invention can be performed using the electroless copper plating solution of the present invention prepared as described above, and in accordance with conventional plating procedures. Upon performing the procedures, it is also preferable to remove dissolved oxygen beforehand from the electroless copper plating solution, and to this end, blowing the solution with an inert gas such as nitrogen or argon prior to commencing the plating process is preferred.

Also, it is preferable that the temperature of the electroless copper plating solution for electroless copper plating in the present invention be 40 to 100° C., and that the processing time be 5 minutes or longer. Further, for the electroless copper plating in the present invention, although it is preferable to use oscillation stirring to prevent unnecessary oxidation of the solution, an inert gas may also be used to simultaneously perform stirring and deoxidizing.

Furthermore, while the pH employed in conventional electroless copper plating is 11 to 14, for electroless copper plating of the present invention, it is preferable to control the pH within the range of 8 to 10. The electroless copper plating in the present invention, if performed at less than the conventional pH range, will not produce the acicular deposition nor the adhesion strength as desired.

In the electroless copper plating for obtaining acicular deposition that was earlier discovered by the present inventors, the general tendency was that phosphorous acid as a reaction byproduct builds up in the plating bath with repeated use of the solution, and that the acicular crystal structure of the plated film disappears relatively quickly.

By comparison, with the electroless copper plating solution in the present invention, thanks to the function of a lithium ion, the acicular crystal structure produced is both densely built in itself and is capable of lasting longer to permit an extended use of the bath to the tune of almost four times as long as the previous invention.

EXAMPLES

In the following descriptions, a more detailed explanation of this invention will be presented based on numerous examples. However, the present invention is not in any way restricted whatsoever to those described in the examples.

Example 1

Preparation of electroless copper plating solution (1):

An electroless copper plating solution is prepared based on the composition given below and according to the conventional method:

(Composition)

Copper sulfate (pentahydrate) 8.0 g/l

Citric acid (monohydrate) 11.0 g/l

50% aq. Hypophosphorous acid 31.0 ml/l

Boric acid 31.0 g/l

Nickel sulfate (hexahydrate) 0.6 g/l

Surfinol 465 0.1 g/l

Lithium hydroxide (monohydrate) 28.8 g/l (pH) 9.0

Using the above electroless copper plating solution, electroless copper plating was provided on a copper-plated laminate (a 35 μm copper foil base) built on top of an epoxy resin substrate, at 70° C., with oscillation stirring applied at a speed of 80 cm/min. The result was examined with an electron microscope to confirm the formation of uniform and acicular crystals as shown in FIG. 1.

Example 2

Preparation of electroless copper plating solution (2):

Based on the electroless copper plating bath of Example 1, an electroless copper plating solution was prepared in exactly the same manner except for changing Surfinol 465 to Emulgen 985.

Figure 2:
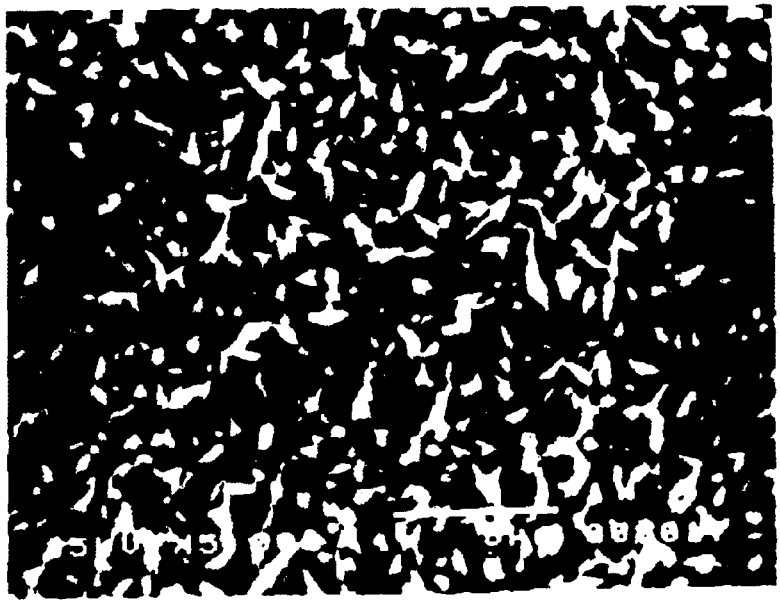
FIG. 2 is an electron microscope picture showing the crystal structure of a copper film obtained with the electroless copper plating solution of Example 2.

Using this electroless copper plating solution, electroless copper plating was provided on a copper-plated laminate built on top of an epoxy resin substrate with exactly the same conditions as in Example 1. The result was examined with the electron microscope to confirm a uniform and acicular deposition as shown in FIG. 2.

Example 3

Preparation of electroless copper plating solution (3):

Based on the electroless copper plating bath of Example 1, an electroless copper plating solution was prepared in exactly the same manner except for changing Surfinol 465 to Esomide HT-60.

Figure 3:
FIG. 3 is an electron microscope picture showing the crystal structure of a copper film obtained with the electroless copper plating solution of Example 3.

Using this electroless copper plating solution, electroless copper plating was provided on a copper-plated laminate built on top of an epoxy resin substrate with exactly the same conditions as in Example 1. The result was examined with the electron microscope to confirm a uniform and acicular deposition as shown in FIG. 3.

Example 4

Preparation of electroless copper plating solution (4):

Based on the electroless copper plating bath of Example 1, an electroless copper plating solution was prepared in exactly the same manner except for changing Surfinol 465 to Pluronic P-85.

Example 5

Preparation of electroless copper plating solution (5):

Based on the electroless copper plating bath of Example 1, an electroless copper plating solution was prepared in exactly the same manner except for changing Surfinol 465 to Tetronic TR-704.

Example 6

Preparation of electroless copper plating solution (6):

Based on the electroless copper plating bath of Example 1, an electroless copper plating solution was prepared in exactly the same manner except for changing Surfinol 465 to Adekatol 80–145.

Example 7

Preparation of electroless copper plating solution (7):

Based on the electroless copper plating bath of Example 1, an electroless copper plating solution was prepared in exactly the same manner except for changing Surfinol 465 to AKYPO MB-2621S.

Example 8

Preparation of electroless copper plating solution (8):

Based on the electroless copper plating bath of Example 1, an electroless copper plating solution was prepared in exactly the same manner except for changing Surfinol 465 to Demor N.

Example 9

Preparation of electroless copper plating solution (9):

Based on the electroless copper plating bath of Example 1, an electroless copper plating solution was prepared in exactly the same manner except for changing Surfinol 465 to Perex NB-L.

Example 10

Preparation of electroless copper plating solution (10):

An electroless copper plating solution was prepared based on the composition given below and according to the conventional method:

(Composition)

Copper sulfate (pentahydrate) 8.0 g/l
Citric acid (monohydrate) 11.0 g/l
50% aq. Hypophosphorous acid 31.0 ml/l
Boric acid 31.0 g/l
Nickel sulfate (hexahydrate) 0.6 g/l
Lithium hydroxide (monohydrate) 28.8 g/l
(pH) 9.0

Figure 4:
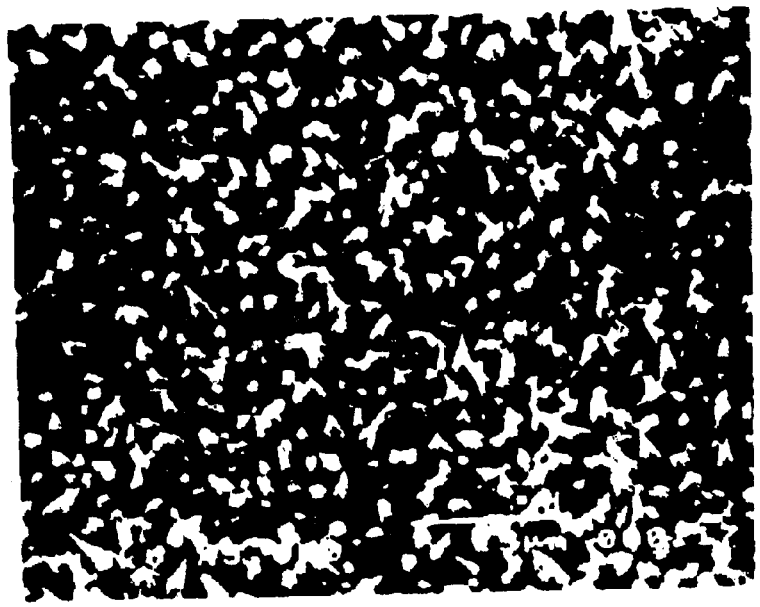
FIG. 4 is an electron microscope picture showing the crystal structure of a copper film obtained with the electroless copper plating solution of Example 10.

Using the above electroless copper plating solution, electroless copper plating was provided on a copper-plated laminate (a 35 $\mu$m copper foil base) built on top of an epoxy resin substrate for 10 minutes at 70° C., with oscillation stirring applied at a speed of 80 cm/min. As a result, a copper deposition of 1.55 $\mu$m was observed. A subsequent observation on the copper film with an electron microscope confirmed the formation of uniform and acicular crystals as shown in FIG. 4.

Comparative Example 1

Preparation of comparative electroless copper plating solution (1):

Based on the electroless copper plating bath of Example 1, an electroless copper plating solution was prepared in exactly the same manner except for changing lithium hydroxide to sodium hydroxide. The amount of sodium hydroxide required to adjust the pH to 9.0 was 26.9 g/l ( 0.67 mol/l).

Comparative Example 2

Preparation of comparative electroless copper plating solution (2):

An electroless copper plating solution was prepared based on the composition given below and according to the conventional method:

(Composition)

Copper sulfate (pentahydrate) 8.0 g/l
Citric acid (dihydrate) 15.6 g/l
Hypophosphorous acid(monohydrate)29.0 g/l
Boric acid 31.0 g/l
Nickel sulfate (hexahydrate) 0.6 g/l
Sodium hydroxide 19.0 g/l
(pH) 9.0

Test Examples

To examine performance of electroless copper plating solutions of Examples 1 through 10 and comparative electroless copper plating solutions obtained in Comparative Examples 1 and 2, test pieces were prepared using copper-plated laminates (35 $\mu$m copper foil base) built on epoxy resin substrates according to the conditions as described below, and were evaluated for the deposition film thickness, deposition appearance, and the peel strength of multi-layer laminated boards prepared after electroless copper plating by press-bonding each test piece using prepreg.

Note the above electroless copper plating was provided by dipping in a 9.0 pH bath for 10 minutes at 70° C., with oscillation stirring applied at a speed of 80 cm/min. The test results are summarized in Table 1.

(Preparation conditions of test pieces)

Sample 1

Electroless copper plating was performed right after the preparation of a fresh electroless copper plating bath according to Example 1.

Sample 2

Based on the electroless copper plating bath according to Example 1, electroless copper plating was performed using the plating bath which had been used for approximately one turn(*) while analyzing and replenishing the spent portions of copper sulfate, hypophosphorous acid, nickel sulfate, and pH (i.e. lithium hydroxide). The amount of phosphorous acid compound (i.e. reaction byproduct) accumulated in the electroless copper plating bath as analyzed at this stage was 0.12 mol/l.

Sample 3

Based on the electroless copper plating bath according to Example 1, electroless copper plating was performed using the plating bath which had been used for approximately four turns (*) while analyzing and replenishing the spent portions of copper sulfate, hypophosphorous acid, nickel sulfate, and pH (i.e. lithium hydroxide). The amount of phosphorous acid compound (i.e. reaction byproduct) accumulated in the electroless copper plating bath as analyzed at this stage was 0.46 mol/l.

Sample 4

Electroless copper plating was performed right after the preparation of a fresh electroless copper plating bath according to Example 2.

Sample 5

Electroless copper plating was performed right after the preparation of a fresh electroless copper plating bath according to Example 3.

Sample 6

Electroless copper plating was performed right after the preparation of a fresh electroless copper plating bath according to Example 4.

Sample 7

Electroless copper plating was performed right after the preparation of a fresh electroless copper plating bath according to Example 5.

Sample 8

Electroless copper plating was performed right after the preparation of a fresh electroless copper plating bath according to Example 6.

Sample 9

Electroless copper plating was performed right after the preparation of a fresh electroless copper plating bath according to Example 7.

Sample 10

Electroless copper plating was performed right after the preparation of a fresh electroless copper plating bath according to Example 8.

Sample 11

Electroless copper plating was performed right after the preparation of a fresh electroless copper plating bath according to Example 9.

Sample 12

Electroless copper plating was performed right after the preparation of a fresh electroless copper plating bath according to Example 10.

Sample 13

Electroless copper plating was performed right after the preparation of a fresh electroless copper plating bath according to Comparative Example 1.

Sample 14

Based on the electroless copper plating bath according to Comparative Example 1, electroless copper plating was performed using the plating bath which had been used for approximately one turn(*) while analyzing and replenishing the spent portions of copper sulfate, hypophosphorous acid, nickel sulfate, and pH (i.e. lithium hydroxide). The amount of phosphorous acid compound (i.e. reaction byproduct) accumulated in the electroless copper plating bath as analyzed at this stage was 0.11 mol/l.

Sample 15

Based on the electroless copper plating bath according to Comparative Example 1, electroless copper plating was performed using the plating bath which had been used for approximately four turns(*) while analyzing and replenishing the spent portions of copper sulfate, hypophosphorous acid, nickel sulfate, and pH (i.e. lithium hydroxide). The amount of phosphorous acid compound (i.e. reaction byproduct) accumulated in the electroless copper plating bath as analyzed at this stage was 0.49 mol/l.

Sample 16

Electroless copper plating was performed right after the preparation of a fresh electroless copper plating bath according to Comparative Example 2.

(*): A "turn" refers to a condition where the ingredients in a freshly prepared plating bath have all been spent and replaced. Specifically, "one turn" is the point at which an amount of copper sulfate equivalent to that used in the original bath was replenished, and "four turns" likewise means that the cumulative replenishment is four times that used in the original bath.

(Results)

TABLE 1

| Sample | Deposition Film Thickness ($\mu$m) | Deposition Appearance | Peel Strength (kgf/cm) |
|---|---|---|---|
| 1 | 1.21 | Acicular deposition | 1.50–1.65 |
| 2 | 1.20 | Acicular deposition | 1.48–1.60 |
| 3 | 1.02 | Acicular deposition partly mixed with granular deposition | 1.30–1.45 |
| 4 | 1.25 | Acicular deposition | 1.48–1.63 |
| 5 | 1.17 | Acicular deposition | 1.46–1.59 |
| 6 | 1.21 | Acicular deposition | 1.30–1.45 |
| 7 | 1.20 | Acicular deposition | 1.29–1.45 |
| 8 | 1.19 | Acicular deposition | 1.28–1.46 |
| 9 | 1.18 | Acicular deposition | 1.35–1.50 |
| 10 | 1.22 | Acicular deposition | 1.32–1.47 |
| 11 | 1.19 | Acicular deposition | 1.30–1.44 |
| 12 | 1.55 | Acicular deposition | 1.20–1.35 |
| 13 | 1.25 | Acicular deposition partly mixed with granular deposition | 1.40–1.52 |
| 14 | 0.97 | Mixed granular/acicular depositions | 0.91–1.08 |
| 15 | 0 | No deposition | 0.38–0.45 |
| 16 | 1.19 | Granular deposition | 1.10–1.19 |

The above results clearly indicate that the samples using the electroless copper plating solution in the present invention (i.e. Samples No. 1, 4 through 12) demonstrate sufficient metal depositions that are of acicular form and have excellent adhesion strength. It is also obvious that the above performance is well sustained after repeated use (Samples 2 and 3) to indicate utility in industrial applications. By contrast, in the comparative electroless copper plating solution, while a certain degree of performance exists at the beginning (Sample 13), such performance tends to be degraded with repeated use (Samples 14 and 15), suggesting a disadvantage in actual industrial application.

INDUSTRIAL APPLICABILITY

The copper film obtained through the electroless copper plating in the present invention has a uniform and acicular structure that provides excellent adhesion to the prepreg resin. In addition, since the coating is made up of metallic copper as opposed to copper oxide or cuprous oxide which are the products of conventional methods, there is hardly any occurrence of a "pink ring" (or "haloing") in the through-hole plating process.

Accordingly, the electroless copper plating solution and the method for an electroless copper plating of the present invention can be advantageously utilized in manufacturing various electronic parts such as multi-layer printed circuit boards for industrial use, multi-layer substrates for build-up systems, flexible substrates, IC packages, or input/output terminals; as well as for such purposes as enhancing metal to resin bonding in manufacturing other industrial products such as electromagnetic shields or molds.

What is claimed is:

1. An electroless copper plating solution, comprising:

a copper ion, a complexing agent, a hypophosphorous acid compound as a reducing agent, a metallic catalyst for initiating a reductive reaction, a lithium ion, and a polyoxyethylene surfactant containing a carbon triple bond in the molecule, wherein said polyoxyethylene surfactant containing a carbon triple bond in the molecule is represented by formula (I):

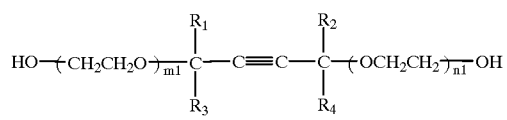

(I)

wherein $R^1$ and $R^2$ represent alkyl groups;

$R^3$ and $R^4$ represent a hydrogen atom or a lower alkyl group; and ml and nl are numbers whose sum is equal to 3.5 to 30.

2. The electroless copper plating solution according to claim 1, wherein the source of a lithium ion is either lithium hydroxide or lithium carbonate.

3. The electroless copper plating solution according to claim 1, wherein the solution's hydrogen exponent (pH) is between 8 and 10.

* * * * *